(12) United States Patent
Choi et al.

(10) Patent No.: US 8,034,705 B2
(45) Date of Patent: Oct. 11, 2011

(54) METHOD OF FORMING A SEAM-FREE TUNGSTEN PLUG

(75) Inventors: Suk-Hun Choi, Suwon-si (KR);
Chang-Ki Hong, Seongnam-si (KR);
Yoon-Ho Son, Yongin-si (KR);
Ju-Young Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 12/460,318

(22) Filed: Jul. 16, 2009

(65) Prior Publication Data

US 2010/0015801 A1   Jan. 21, 2010

(30) Foreign Application Priority Data

Jul. 17, 2008   (KR) .................. 10-2008-0069700

(51) Int. Cl.
*H01L 21/4763* (2006.01)

(52) U.S. Cl. .. 438/622; 438/626; 438/635; 257/E21.583

(58) Field of Classification Search .................. 438/658, 438/608, 622, 626, 629, 635; 257/E21.583
See application file for complete search history.

(56) References Cited

U.S. PATENT DOCUMENTS

| 5,244,534 | A | * | 9/1993 | Yu et al. | 438/672 |
|---|---|---|---|---|---|
| 6,638,861 | B1 | | 10/2003 | Ngo et al. | |
| 6,872,656 | B2 | * | 3/2005 | Sakai | 438/637 |
| 2006/0141771 | A1 | * | 6/2006 | Jang | 438/633 |
| 2008/0247214 | A1 | * | 10/2008 | Ufert | 365/148 |
| 2008/0304312 | A1 | * | 12/2008 | Ho et al. | 365/148 |

FOREIGN PATENT DOCUMENTS

| JP | 5-299397 | 11/1993 |
|---|---|---|
| KR | 1998-029400 | 7/1998 |
| KR | 10-0234398 B1 | 9/1999 |

* cited by examiner

*Primary Examiner* — Michael Trinh
(74) *Attorney, Agent, or Firm* — Onello & Mello, LLP

(57) ABSTRACT

A plug comprises a first insulating interlayer, a tungsten pattern and a tungsten oxide pattern. The first insulating interlayer has a contact hole formed therethrough on a substrate. The tungsten pattern is formed in the contact hole. The tungsten pattern has a top surface lower than an upper face of the first insulating interlayer. The tungsten oxide pattern is formed in the contact hole and on the tungsten pattern. The tungsten oxide pattern has a level face.

6 Claims, 18 Drawing Sheets

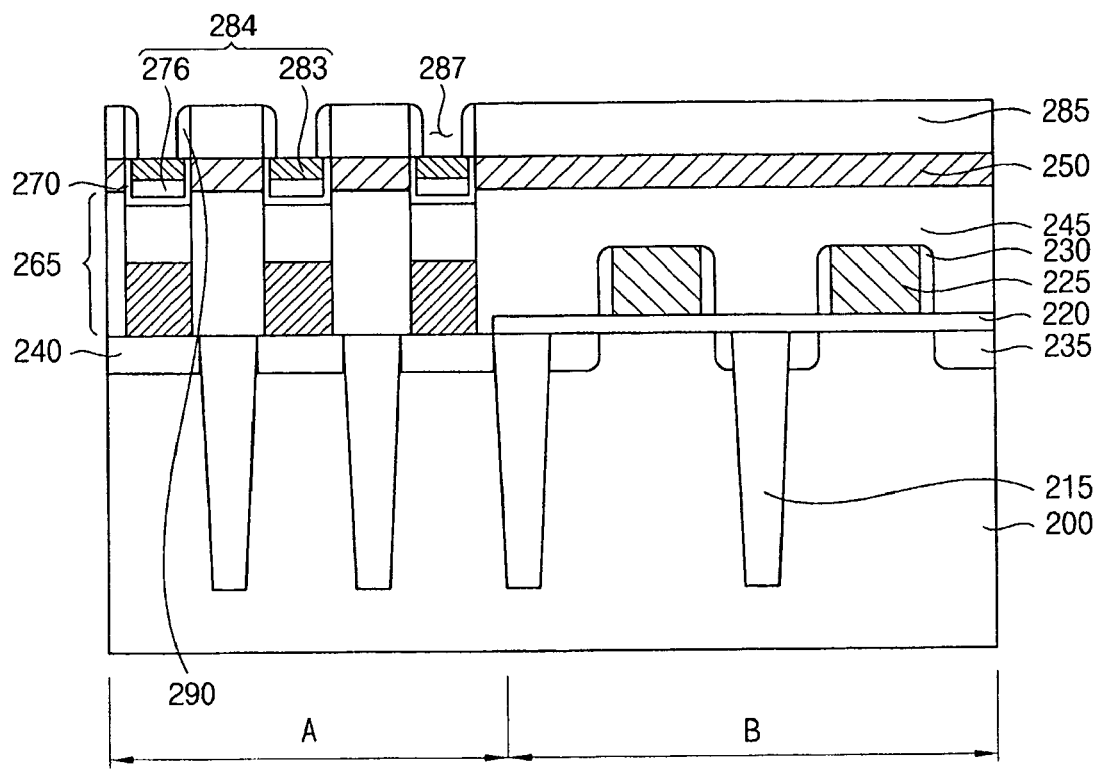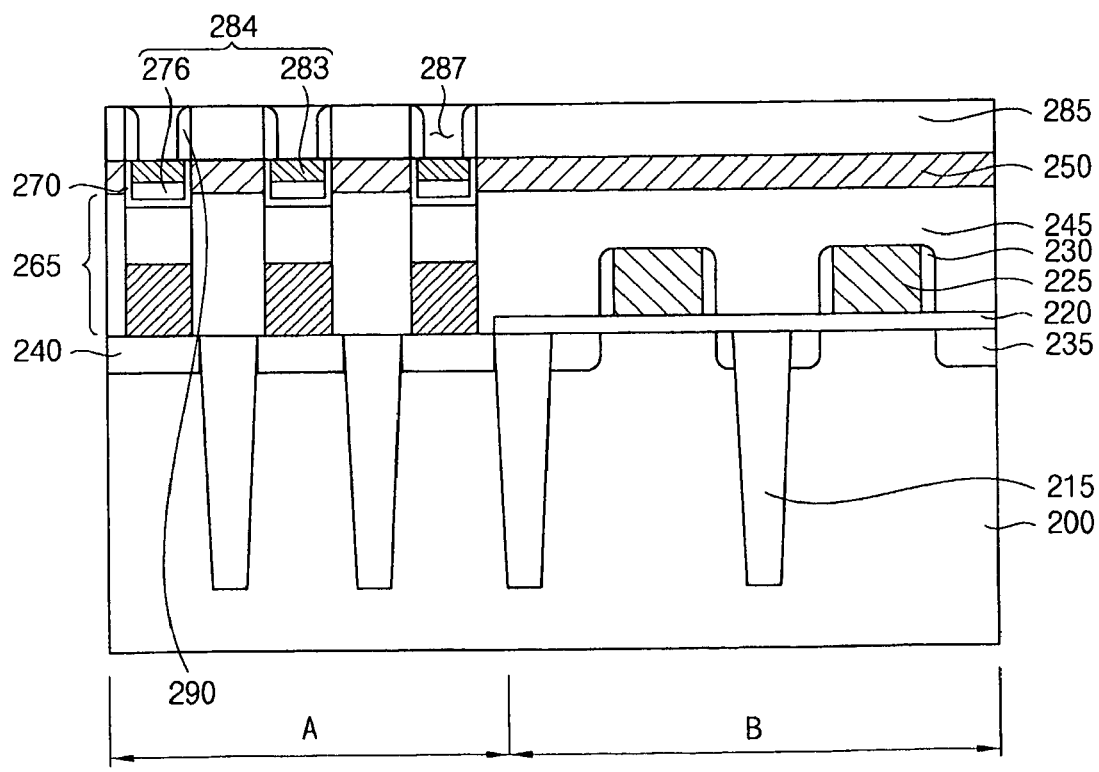

METHOD OF FORMING A SEAM-FREE TUNGSTEN PLUG

RELATED APPLICATION

This application claims priority under 35 U.S.C. 119 to Korean Patent Application No. 10-2008-0069700, filed in the Korean Intellectual Property Office on Jul. 17, 2009, the entire content of which are incorporated herein by reference.

BACKGROUND

1. Field

Exemplary embodiments relate to a tungsten plug, a method of forming a tungsten plug and a semiconductor device having a tungsten plug. More particularly, exemplary embodiments relate to a seam-free tungsten plug, a method of forming a seam-free tungsten plug and a semiconductor device having a seam-free tungsten plug.

2. Description of the Related Art

A semiconductor memory device may be classified as either a volatile memory device or a non-volatile memory device. The volatile memory device requires power in order to maintain its stored information, unlike the non-volatile memory device which does not require that power be maintained in order to retain its data. Types or volatile memory devices include a DRAM (dynamic random access memory), a SRAM (static random access memory), etc. Types of non-volatile memory devices include a flash memory device, an EEPROM (electrically erasable programmable read only memory), etc.

Recently, a PRAM (phase-changeable random access memory), one type of non-volatile memory device, has been developed. The PRAM stores or erases data using a resistance between two states, a crystalline state and an amorphous state, by a phase transition. That is, the PRAM stores or erases data "1" and "0" using a reversible phase transition of a phase-changeable material layer, which typically includes germanium (Ge)-antimony (Sb)-tellurium (Te), and which is a chalcogenide material. For example, a reset current for converting a crystalline state into an amorphous state having a resistance larger than that of the crystalline state and a set current for converting an amorphous state into a crystalline state having a resistance smaller than that of the amorphous state may be transmitted from a diode to the phase-changeable material layer through a lower electrode. The lower electrode may be formed between the phase-changeable material layer and the diode. A metal silicide layer or a metal layer may be further formed between the diode and the lower electrode to reduce resistance of an interface therebetween.

As the size of a semiconductor memory device is decreased, the size of a region at which the diode and the lower electrode make contact with each other is also reduced. Because the region where the diode and the lower electrode make contact with each other is reduced, when a plug is formed in the region, a seam or a void may be generated in the region. When the seam or the void is exposed, it may be difficult to control a resistance of the plug.

SUMMARY

Exemplary embodiments provide a plug, a method of forming a plug and a phase changeable memory device having a plug.

According to one aspect of the exemplary embodiments, a plug comprises a first insulating interlayer, a tungsten pattern and a tungsten oxide pattern. The first insulating interlayer has a contact hole formed therethrough on a substrate. The tungsten pattern is formed in the contact hole. The tungsten pattern has a top surface lower than an upper face of the first insulating interlayer. The tungsten oxide pattern is formed in the contact hole and on the tungsten pattern. The tungsten oxide pattern has a level face.

In an exemplary embodiment, the tungsten oxide pattern has a level top surface substantially the same as that of the first insulation interlayer.

In an exemplary embodiment, the tungsten pattern may have a void enclosed by the tungsten pattern.

In an exemplary embodiment, a barrier metal layer may be further formed on a sidewall of the contact hole.

In an exemplary embodiment, the tungsten oxide pattern may protrude over the first insulating interlayer and a second insulating interlayer may be further formed on the first insulating interlayer to enclose a sidewall of the protruding tungsten oxide pattern.

In an exemplary embodiment, a barrier metal layer may be further only formed on a sidewall of the contact hole.

According to another aspect of exemplary embodiments, there is provided a method of forming a plug. A first insulating interlayer is formed on a substrate. A contact hole is formed through the first insulating interlayer. A tungsten pattern is formed in the contact hole. An upper portion of the tungsten pattern is converted into a tungsten oxide pattern.

In an exemplary embodiment, forming the tungsten pattern may include forming a tungsten layer in the contact hole to fill up the contact hole and planarizing the tungsten layer to form the tungsten pattern having a top surface substantially lower than that of the first insulating interlayer.

In an exemplary embodiment, the upper portion of the tungsten pattern may be converted by a rapid thermal annealing process or a plasma oxidation process.

In an exemplary embodiment, the upper portion of the tungsten pattern may be converted by re-growing or swelling the tungsten pattern. As a result, the tungsten oxide pattern may be protruded over the first insulating interlayer. The protruded tungsten oxide pattern may be planarized until the first insulating interlayer is exposed.

In an exemplary embodiment, forming the tungsten pattern may include forming a tungsten layer in the contact hole to fill up the contact hole and planarizing the tungsten layer to form the tungsten pattern having a top surface substantially higher than that of the first insulating interlayer.

In an exemplary embodiment, the upper portion of the tungsten pattern may be converted by re-growing or swelling the tungsten pattern. As a result, the tungsten oxide pattern may be protruded over the first insulating interlayer. A second insulating interlayer may be further formed on the first insulating interlayer to cover the tungsten oxide pattern and the second insulating interlayer may be removed until the tungsten oxide pattern is exposed.

In an exemplary embodiment, forming a tungsten pattern may include forming a void enclosed by the tungsten pattern may be formed in the contact hole.

In an exemplary embodiment, the upper portion of the tungsten pattern may be planarized to open the void. Converting the upper portion of the tungsten pattern into the tungsten oxide pattern includes closing the void, the void being closed by the tungsten oxide pattern. Alternatively, when upper portion of the tungsten pattern is converted into the tungsten oxide pattern, the void may be removed.

According to another aspect of exemplary embodiments, there is provided a phase changeable memory device. A single crystalline silicon layer is formed on an upper portion of a substrate. A first insulating interlayer having a contact hole is formed through the first insulating interlayer on the substrate. The contact hole exposes the single crystalline silicon layer. A diode is formed on the single crystalline silicon layer in the contact hole. A tungsten pattern is formed on the diode in the contact hole. The tungsten pattern has a top surface lower than an upper face of the first insulating interlayer. A tungsten oxide pattern is formed in the contact hole and on the tungsten pattern. The tungsten oxide pattern has a level face. A phase-changeable layer is electrically connected to the tungsten oxide pattern.

In an exemplary embodiment, the tungsten oxide pattern has a level top surface substantially the same as that of the first insulating interlayer.

In an exemplary embodiment, the tungsten pattern has a void.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 8 to 27 are cross-sectional views illustrating a method of manufacturing a phase-changeable memory device in accordance with some exemplary embodiments of the present invention.

DESCRIPTION OF EMBODIMENTS

Figure 1:
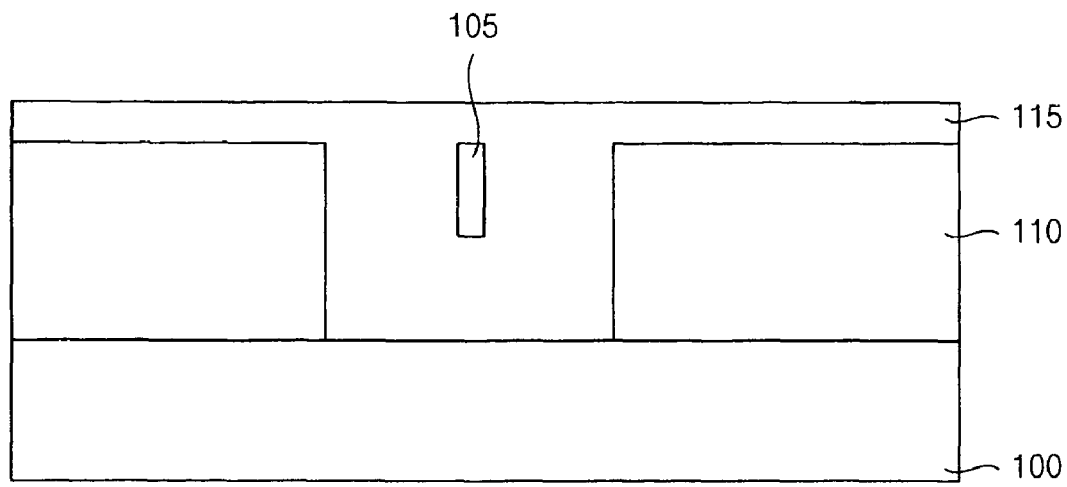
FIGS. 1 to 3, 6 and 7 are cross-sectional views illustrating a method of forming a plug in accordance with exemplary embodiments.

This application claims priority under 35 USC §119 to Korean Patent Application No. 10-2008-0069700 filed on Jul. 17, 2009 in the Korean Intellectual Property Office (KIPO), the contents of which are herein incorporated by reference in their entirety.

Various exemplary embodiments will be described more fully hereinafter with reference to the accompanying drawings, in which some exemplary embodiments are illustrated. The present invention may, however, be embodied in many different forms and should not be construed as limited to the exemplary embodiments set forth herein. Rather, these exemplary embodiments are provided so that this description will be thorough and complete, and will fully convey the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For exemplary, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for exemplary, of manufacturing techniques and/or tolerances, are to be expected. Thus, exemplary embodiments should not be construed as limited to the particular shapes of regions illustrated herein but are to include deviations in shapes that result, for exemplary, from manufacturing. For exemplary, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 3, 6 and 7 are cross-sectional views illustrating a method of forming a plug in accordance with exemplary embodiments.

Referring to FIG. 1, a first insulating interlayer (not illustrated) is formed on a substrate 100. A lower structure (not illustrated) may be further formed on the substrate 100. The lower structure may include a gate structure, an isolation layer, a capacitor, a source/drain region, a wire structure, etc.

The first insulating interlayer may be formed by a chemical vapor deposition (CVD) process or a high-density plasma (HDP) process. The first insulating interlayer may be formed using an oxide material. The first insulating interlayer is patterned to form a first insulating interlayer pattern 110 having a contact hole exposing the lower structure.

A barrier metal layer (not illustrated) may be further formed along a sidewall and a bottom of the contact hole. The barrier metal layer may have a uniform profile. The barrier metal layer may be formed using refractory metal such as titanium, tantalum, tungsten and/or refractory metal nitride such as titanium nitride, tantalum nitride. The barrier metal layer may prevent a high resistance between the lower structure and the plug, which is formed on the lower structure and described in detail below. Additionally, the barrier metal layer may increase an adhesion characteristic between the barrier metal layer and a layer formed subsequently directly on the barrier metal layer.

A conductive layer 115 is formed on the contact hole and the first insulating interlayer to fill up the contact hole. The conductive layer 115 may be formed using metal such as tungsten. A first void 105 may be formed in the contact hole. The first void 105 may be enclosed by the conductive layer 115. The conductive layer 115 is electrically connected to the lower structure.

Figure 2A:
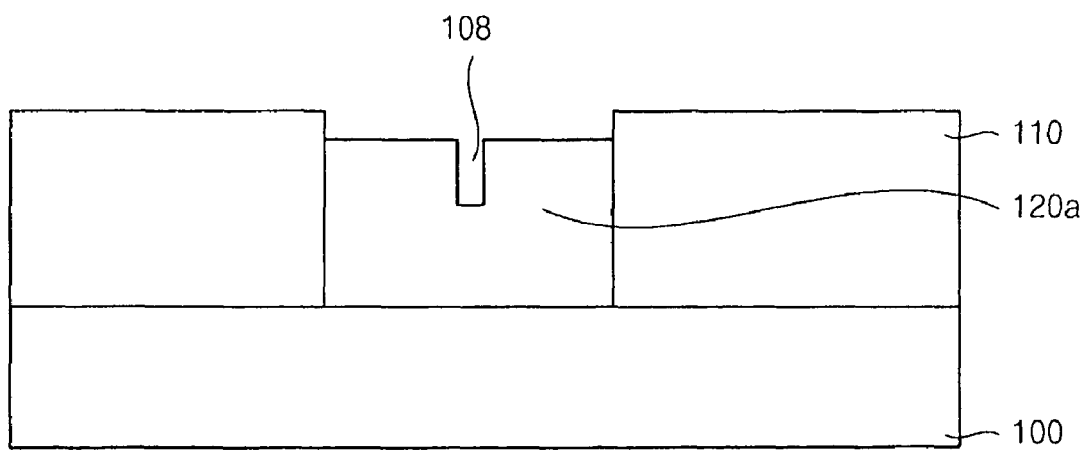
Figure 2B:
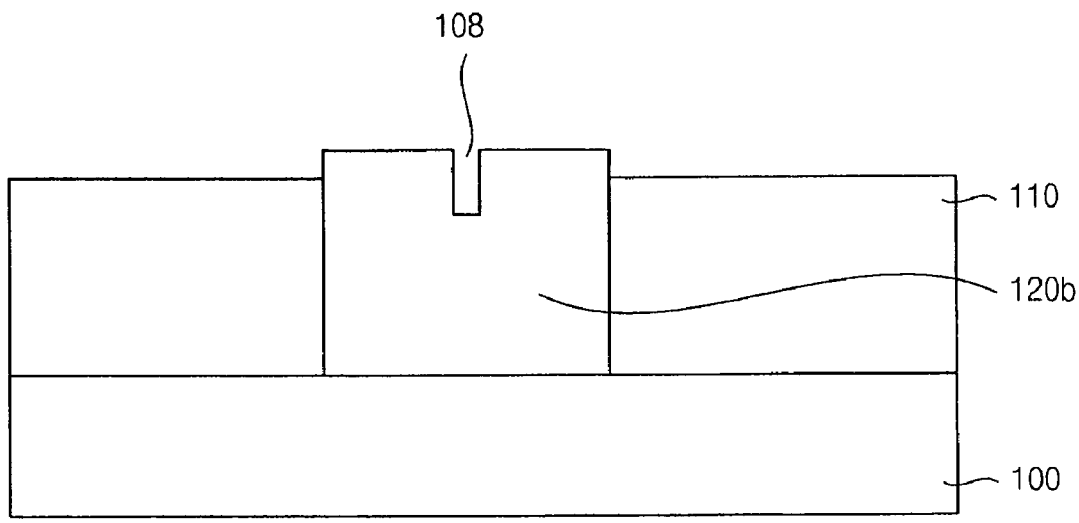
Figure 2C:
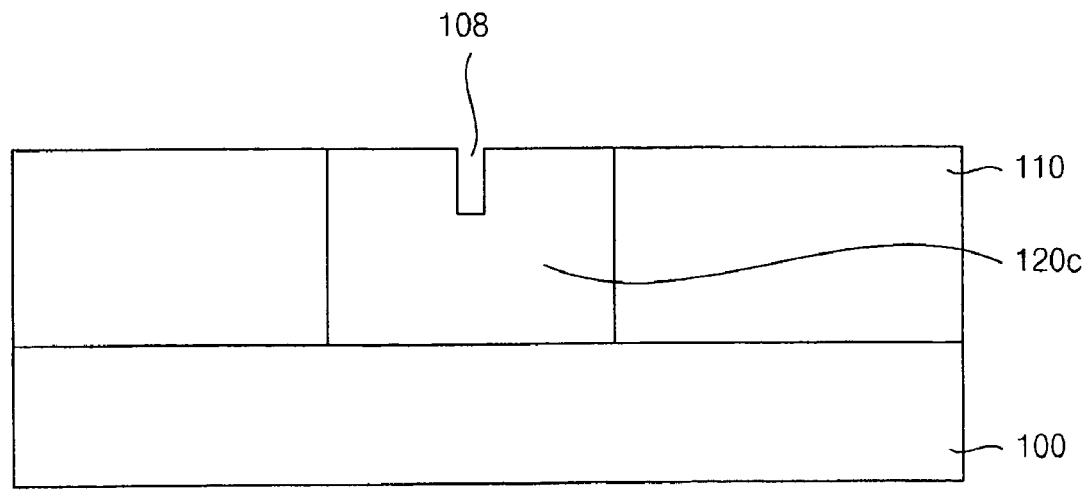

Referring to FIGS. 2A and 2C, an upper portion of the conductive layer 115 is removed to form a conductive layer pattern in the contact hole. For example, the conductive layer 115 is planarized to form a conductive layer pattern in the contact hole. The planarization process may be performed using a chemical mechanical polishing (CMP) process. Depending upon the slurry used in the CMP process and/or the CMP process, the conductive layer pattern may have a different height. FIGS. 2A to 2C illustrate cross-sectional views of the conductive layer patterns 120a, 120b and 120c, respectively, after performing the planarization process in accordance with some exemplary embodiments of the present invention. For example, referring FIG. 2A, the conductive layer pattern 120a has a surface lower than that of the first insulating interlayer pattern 110. The void 105 is exposed by the planarization process to form an opening 108. In this embodiment, a first slurry having an etching selectivity with respect to a metal, especially tungsten, may be used in the CMP process. For example, the first slurry may include hydrogen peroxide ($H_2O_2$) of which percent is over about 2 percent with respect to the overall first slurry. Referring to FIG. 2B, the conductive layer pattern 120b has a surface higher than that of the first insulating interlayer pattern 110. In an exemplary embodiment, the conductive layer pattern 120b may be formed by a CMP process having 2 steps. In the first step of the CMP process, the first slurry is used to remove an upper portion of the conductive layer 115 to form the conductive layer pattern 120b having a surface lower than that of the first insulating interlayer pattern 110. Then, in a second step of the CMP process, a second slurry having hydrogen peroxide ($H_2O_2$) of which percent is below about 0.5 percent with respect to the overall first slurry is used to control a height difference between the second conductive layer pattern 120b and the first insulating interlayer pattern 110. The second slurry may have an etching selectivity with respect to the first insulating interlayer pattern 110. Referring to FIG. 2C, the conductive layer pattern 120c has a surface having substantially the same height as that of the first insulating interlayer pattern 110. The void 105 is exposed by the planarization process to form the opening 108.

Figure 3A:
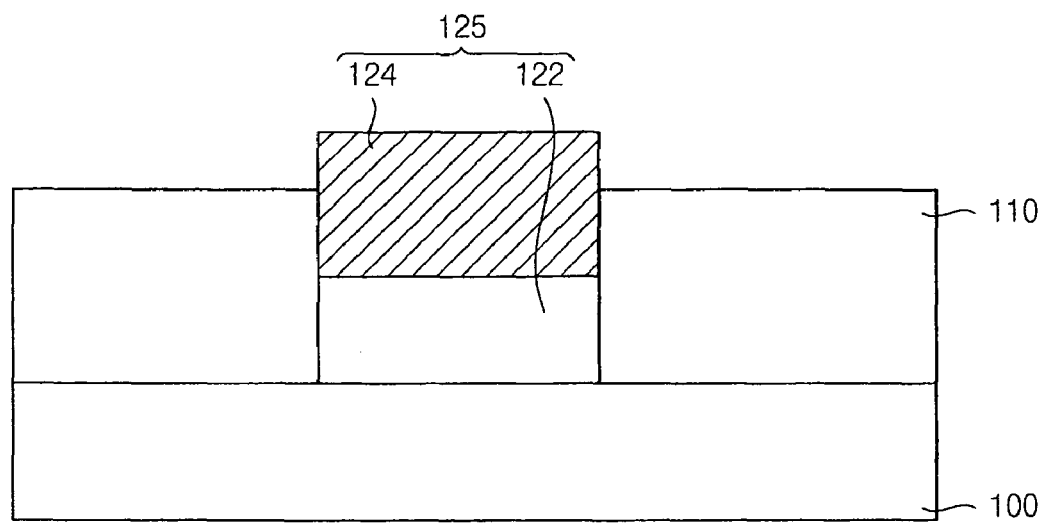
Figure 3B:
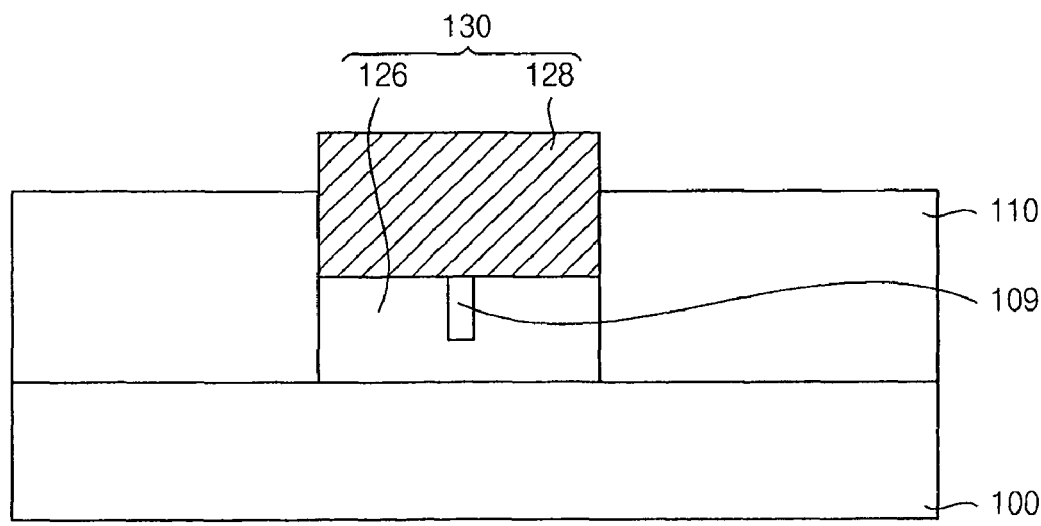

Referring to FIGS. 3A and 3B, an upper portion of the conductive layer pattern 120 is re-grown or swelled to form a plug 125, 130, so that an upper portion of the opening 108 is closed or the opening does not remain in the plug. The plug has a substantially level top surface, and the top surface is higher than that of the first insulating interlayer pattern 110 due to the re-growth or swelling. The plug may include an upper plug portion 124 including re-growth or swelled portion, and a lower plug portion 122, which has substantially the same material as the conductive layer pattern 120. The re-growth or swelling process may be performed by a plasma oxidation process and/or a rapid thermal annealing (RTA) process. The re-growth or swelling of the conductive layer pattern 120 may be caused by a reaction of a material included in the conductive layer pattern 120 and oxygen atoms. After the re-growth or swelling process is performed, the opening 108 may remain in the plug or may no longer exist in the plug. However, even when the opening 108 remains in the plug, an upper portion of the opening 108 is closed to form a void in the plug. The re-growth portion (the upper portion of the plug formed by reaction of a material included in the conductive layer pattern and oxygen atoms) is formed upward and downward with respect to a top face of the conductive layer pattern.

Referring to FIG. 3A, the opening 108 included in the conductive layer pattern does not exist after the re-growth or swelling process. That is, because a portion where the reaction of a material included in the conductive layer pattern and oxygen atoms occurs may have a depth substantially the same as that of the opening 108, the plug 125 does not have the opening 108. Because the plug 125 has no opening therein, after the plug 125 is planarized to form a plug pattern (135, see FIG. 6) by a successive planarization process, the plug pattern 135 may have a level surface. Referring to FIG. 3B, a plug 130 includes an upper plug portion 128 including re-growth or swelled portion, and a lower plug portion 126 having a second void 109. The second void 109 remains in the plug 130 after the re-growth or swelling process. The second void 109 may be formed under a level higher than or substantially the same as an interface between the upper plug portion 128 and the lower plug portion 126. However, the second void 109 is not exposed after a successive planarization process planarizing the plug 130 because the second void is formed under a level lower than a top surface of the first insulating interlayer pattern 110. Thus, a plug pattern (136, see FIG. 7) formed by the successive planarization process may have a level surface.

Figure 4:
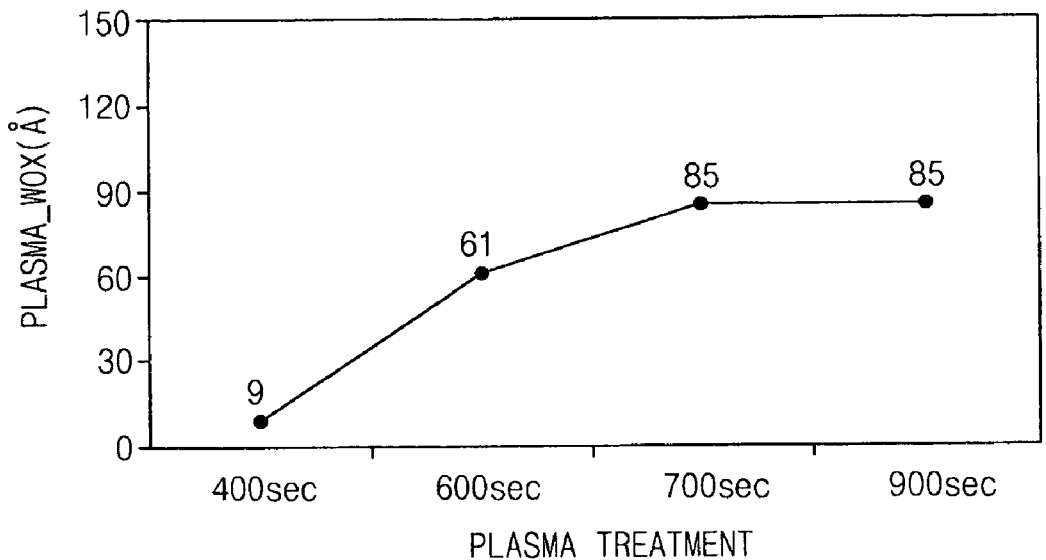
FIGS. 4 and 5 are graphs illustrating re-growth of a tungsten plug by a plasma treatment process and a rapid thermal annealing process, respectively.
Figure 5:
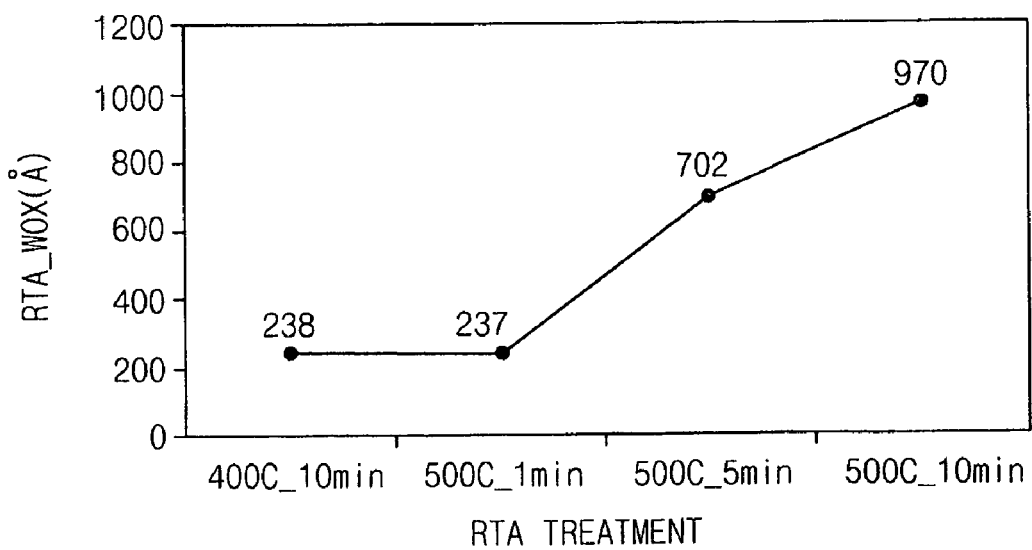

In an exemplary embodiment, the conductive layer patterns 120a, 120b and 120c may be formed using tungsten. When tungsten is used as the conductive layer patterns 120a, 120b and 120c, the upper plug portions 124 and 128 may include tungsten oxide. FIGS. 4 and 5 are graphs illustrating re-growth of a tungsten plug by a plasma treatment process and a rapid thermal annealing process, respectively. Referring to FIGS. 4 and 5, when the RTA process is used for the re-growth of tungsten, re-growth rate of tungsten is faster than when the plasma treatment process is performed.

Figure 6:
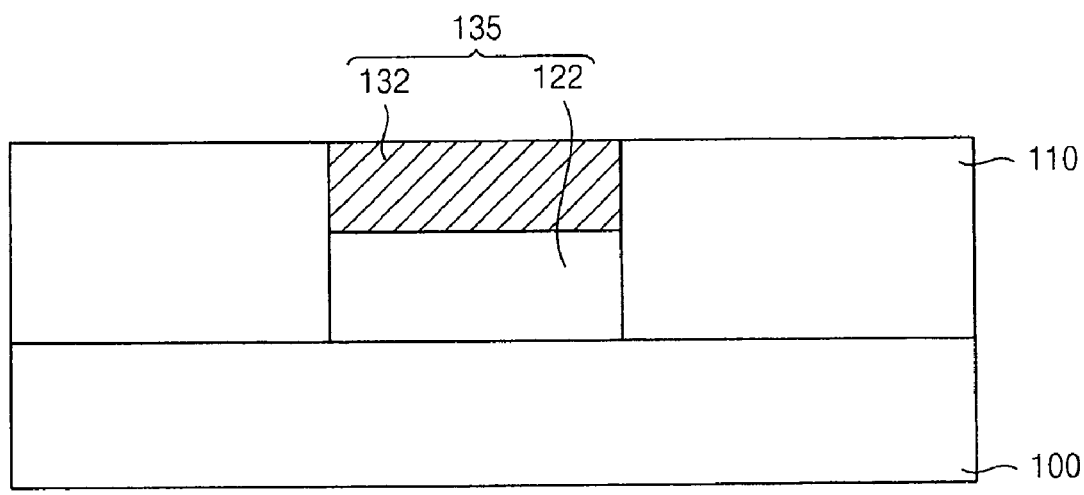
Figure 7:
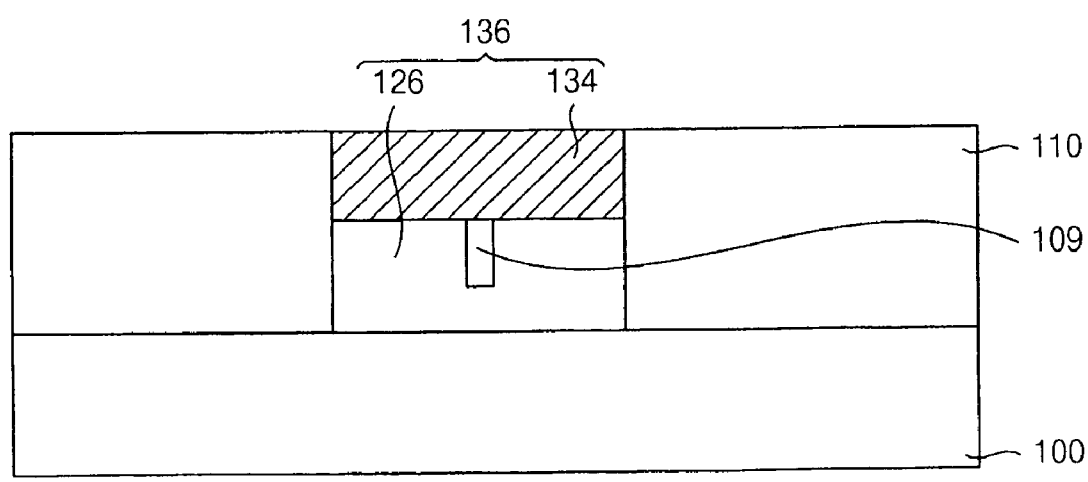

Referring to FIGS. 6 and 7, the plug 125, 130 is planarized to form a plug pattern 135, 136. In an exemplary embodiment, an insulation layer (not illustrated) is formed on the first insulating interlayer pattern 110 to cover the plug 125, 130. The insulation layer may be formed using oxide by a CVD process or HDP process. The insulation layer is planarized until the plug 125, 130 is exposed. In this case, the insulation layer remains on the first insulating interlayer pattern 110 to enclose a sidewall of the plug pattern. Alternatively, the insulation layer and the plug 125, 130 are planarized until the first insulating interlayer pattern 110 is exposed. The planarization process may include a CMP process. The CMP process may be performed using a slurry having an etching selectivity with respect to the insulation layer. Because a barrier metal layer is not formed on sidewalls of the upper plug portions 124 and 128 protruding with respect to a top face of the first insulating interlayer 100, the planarization process may be readily performed, and a metal bridge failure may be prevented. In addition, after performing the planarization process, the plug pattern 135, 136 may have a level surface.

In an exemplary embodiment, the plug patterns 135 and 136 have an upper plug pattern 132 and 134, respectively. The upper plug pattern 132 and 134 may be formed using tungsten oxide. When tungsten is oxidized, the oxidized tungsten has a resistance higher than that of tungsten before the oxidation. Accordingly, an oxidation process oxidizing tungsten has not been used before. However, in the exemplary embodiment, in spite of high resistance of tungsten oxide compared with tungsten, the upper plug pattern 132 and 134 including tungsten oxide is formed by re-growth or swelling of tungsten because an upper portion of the re-growth tungsten oxide having a relatively high resistance is partially removed by the successive CMP process, so that the plug pattern 135 and 136 may obtain planar surfaces and have low resistance.

FIGS. 8 to 27 are cross-sectional views illustrating a method of manufacturing a phase-changeable memory device in accordance with some exemplary embodiments of the present invention.

Figure 8:
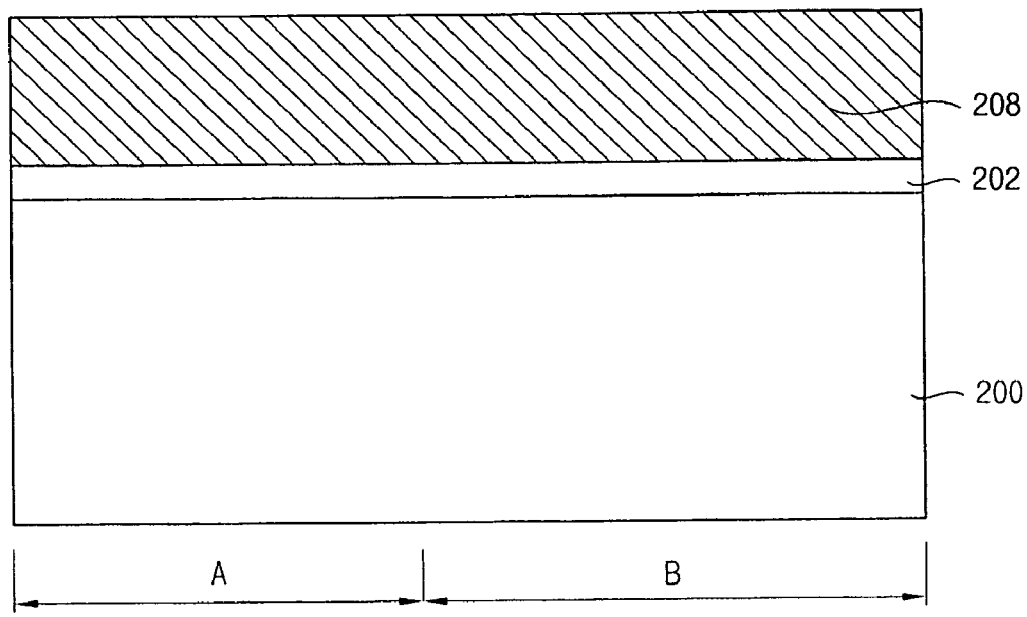

Referring to FIG. 8, a pad oxide layer 202 is formed on a substrate 200. A mask layer 208 is formed on the pad oxide layer 202. The mask may be formed using nitride. The substrate 200 may be divided into a region A for a memory cell and a region B for a peripheral region including a high voltage transistor and a low voltage transistor.

The pad oxide layer 202 may be formed by a thermal oxidation process. The pad oxide layer may have a thickness of about 100 Å to 150 Å. The pad oxide layer 202 may serve as a buffer layer absorbing stress from the mask layer 208 and not transferring contamination of the substrate 200.

The mask layer 208 may be formed by a CVD process. The mask may have a thickness of about 100 Å to 1100 Å. For example, the mask layer 208 may be formed as multi-layered structure in which a first mask layer having a thickness of about 300 Å and a second mask layer having a thickness of 700 Å to 800 Å are stacked.

Figure 9:
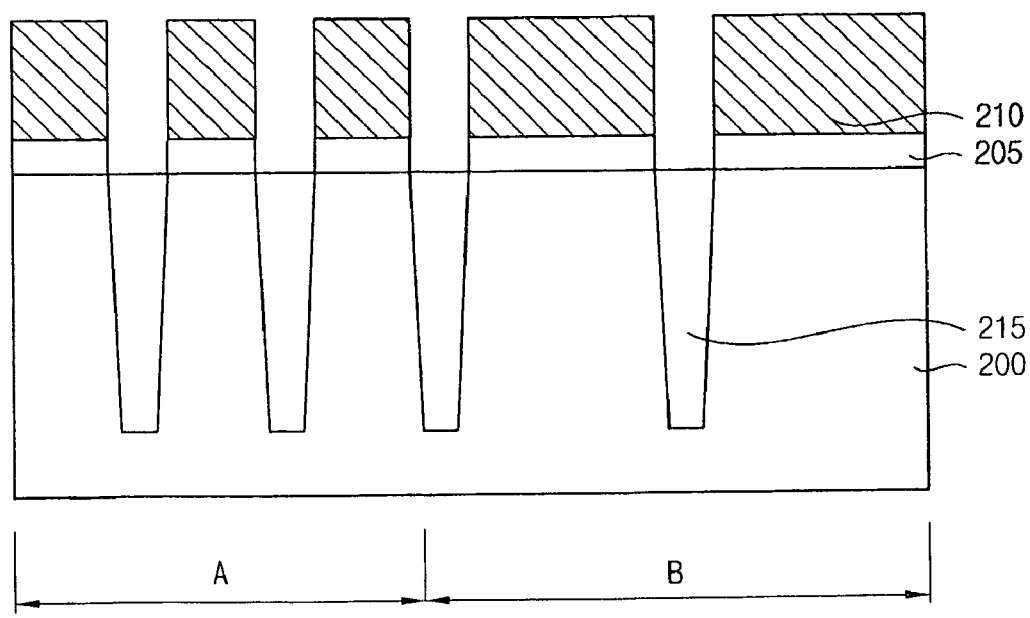

Referring to FIG. 9, the mask layer 208 is patterned to form a mask 210. A distance between the masks 210 on the region A may be substantially smaller than that on the region B. An upper portion of the substrate 200 and the pad oxide layer 202 are patterned to form a trench on an upper portion of the substrate 200 using the mask 210 as an etching mask. In an exemplary embodiment, impurities may be implanted into an upper portion of the substrate 200 adjacent to the trench. The trench may have a thickness of about 2000 Å to 5000 Å. The trench may have a slope. That is, a width of the trench is gradually increased from a bottom of the trench to the top of the trench. The trench is filled with an insulation material to form an isolation layer 215. In an exemplary embodiment, firstly, a thermal oxidation process is performed to the trench, and a middle temperature oxide layer having a thickness of about 100 Å fills the trench. Then, remaining trench space is filled with HDP-CVP oxide layer. A CMP process is further performed to the HDP-CVD oxide layer to planarize the isolation layer 215. Impurities may be implanted into the region B according to a type of transistor formed on the region B.

Figure 10:
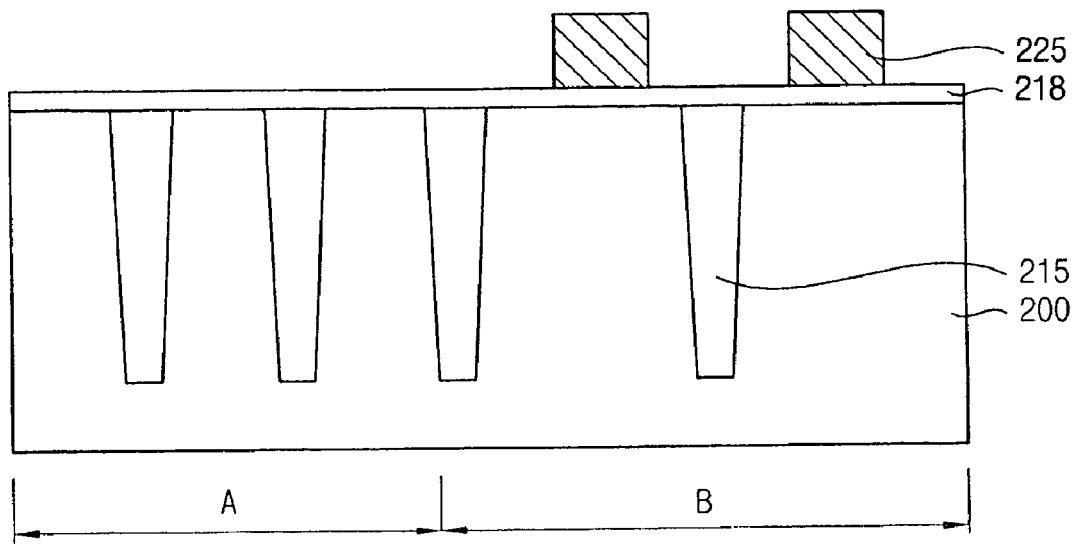

Referring to FIG. 10, the mask 210 and the pad oxide layer pattern 205 are removed and a gate insulation layer 218 is formed on the substrate 200. The gate insulation layer 218 may have different thicknesses according to a type of a transistor formed thereon. A gate electrode 225 is formed on the gate insulation layer 218. A source/drain region (not illustrated) is formed on the substrate 200 adjacent to the gate electrode 225.

Figure 11:
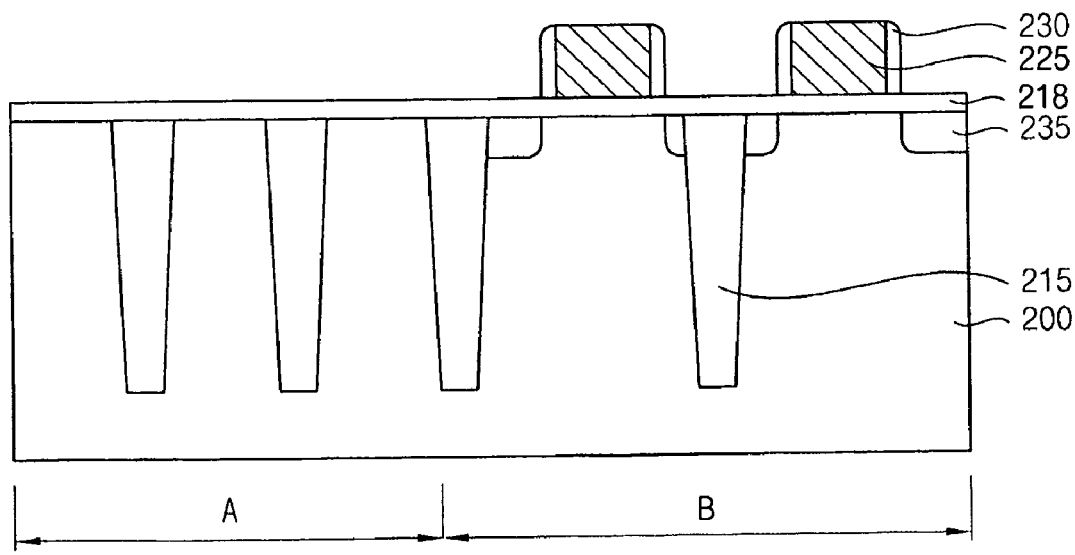

Referring to FIG. 11, a spacer 230 is formed on a sidewall of the gate electrode 225. For example, a nitride layer (not illustrated) is formed on the substrate 200 to cover the gate electrode 225 and an etch back process is performed to form the spacer 230 on a sidewall of the gate electrode 225. After forming the spacer 230, impurities may be further introduced into the substrate adjacent to the gate electrode 225 using the spacer 230 as a mask. Accordingly, a source/drain region 235 may be formed. The source/drain region 235 may include n-type impurities or p-type impurities depending on a type of the gate electrode 225.

Figure 12:
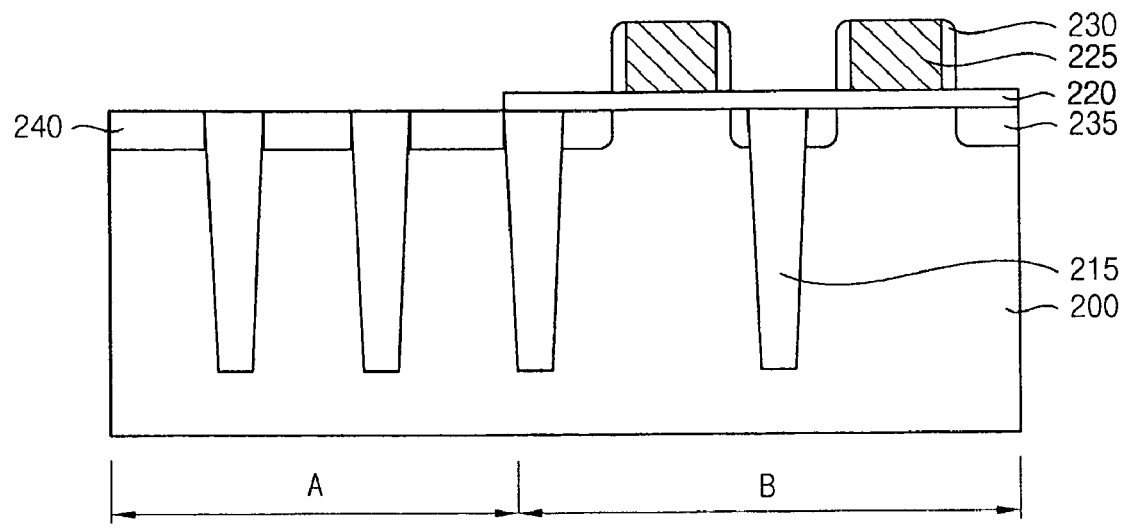

Referring to FIG. 12, a portion of the gate insulation layer 218 on the region A is removed to expose the substrate 200 and form a gate insulation layer pattern 220 on the region B. Impurities are implanted into a portion of the substrate in the region A to form a lower conductive region 240. The lower conductive region 240 may serve as a word line.

When a vertical diode is applied, the vertical diode is formed by an epitaxial growth. Thus, the lower conductive region 240 may include a single crystalline structure.

Figure 13:
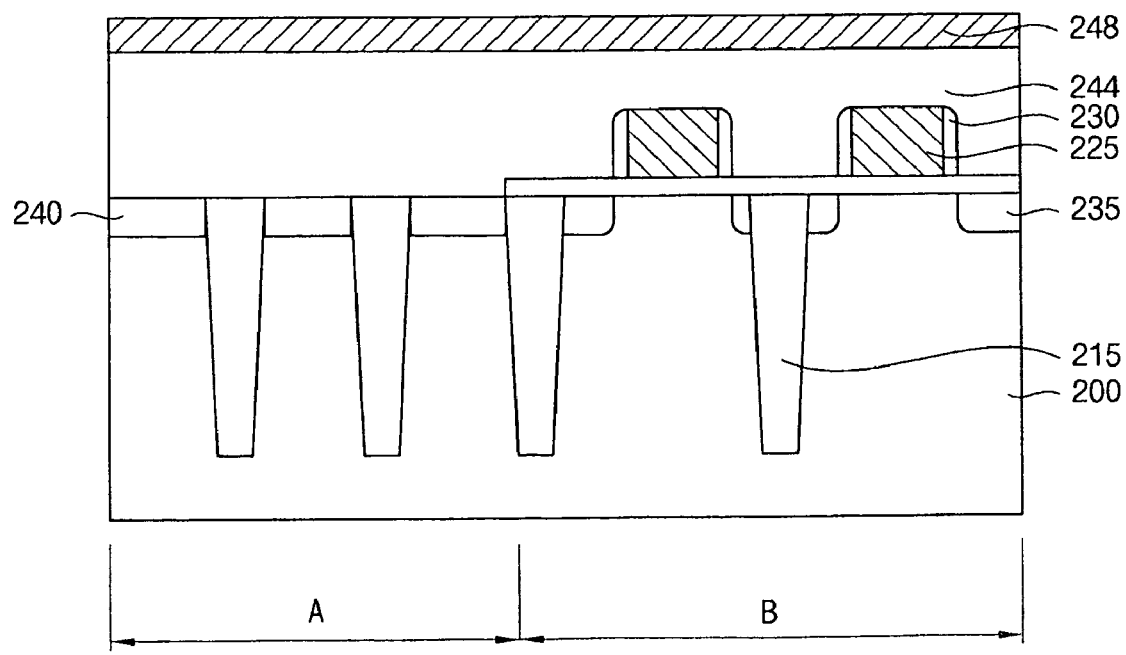

Referring to FIG. 13, a first insulation layer 244 and a second insulation layer 248 are formed on the substrate 200 to cover the gate electrode 225. In an exemplary embodiment, first insulation material (not illustrated) may be formed by depositing HDP-oxide having a thickness of about 5000 Å. The first insulation material is planarized to form a first insulation layer 244 by a CMP process. The second insulation layer 248 having a thickness of about 1500 Å including nitride is formed on the first insulation layer 244.

Figure 14:
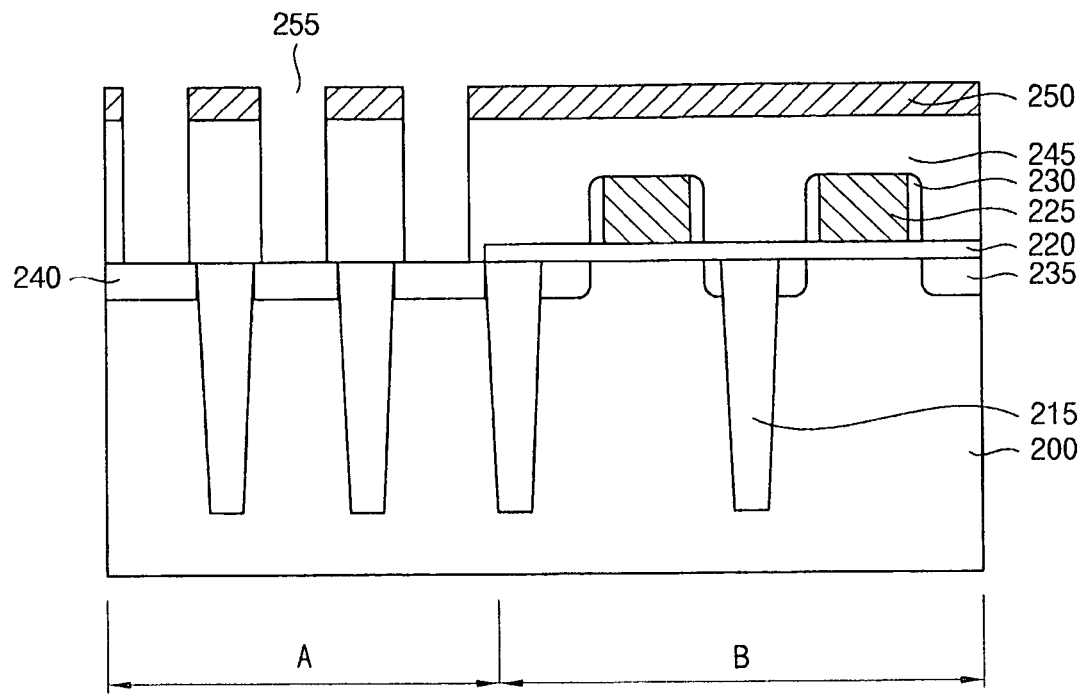

Referring to FIG. 14, an opening 255 exposing the lower conductive region 240 is formed through the first insulation layer 244 and the second insulation layer 248 in the region A. A spacer (not illustrated) may be further formed on a sidewall of the opening 255. A washing process may be further performed inside of the opening 225.

Figure 15:
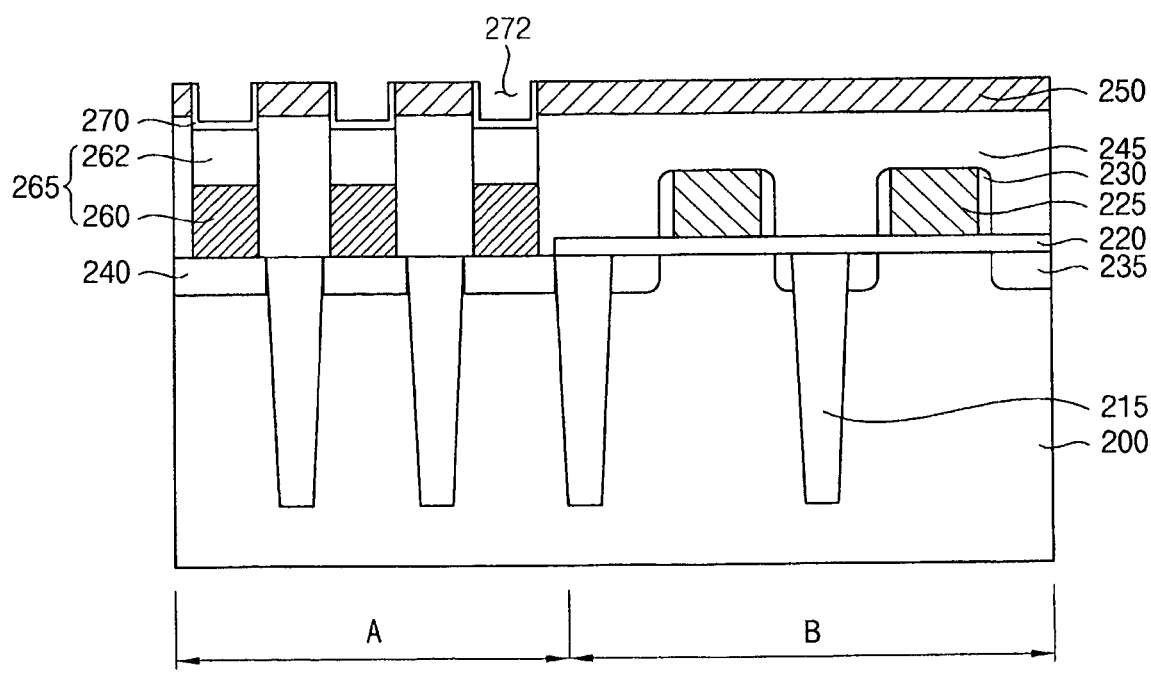

Referring to FIG. 15, a diode 265 and a second opening 272 is formed in the opening 225. A single crystalline silicon layer is formed in the opening 255 by an epitaxial process using the lower conductive region 240 as a seed. In an exemplary embodiment, the single crystalline silicon layer may have a height of about 6000 Å. When the single crystalline silicon layer may protrude over the second insulation layer pattern 250, the single crystalline silicon layer may be planarized until the second insulation layer pattern 250 is exposed. Impurities are implanted into the single crystalline silicon layer to form the diode 265. For example, a lower diode portion 260 may be implanted with n-type impurities and an upper diode portion 262 may be implanted with p-type impurities. The diode 265 may be formed in a first insulation layer pattern 245 by an etch back process. For example, an upper portion of the single crystalline silicon layer may be removed by about 1500 Å to form the second opening 272.

A barrier metal layer 270 is formed on the diode 265 and a sidewall of the second opening 272 with a uniform thickness. For example, the barrier metal layer 270 may have a thickness of about 100 Å. The barrier metal layer 270 may be formed using a refractory metal or a refractory metal nitride such as titanium (Ti), titanium nitride (TiN), titanium tungsten composition (TiW), a composition layer of titanium and titanium nitride (Ti/TiN), etc. The barrier metal layer 270 may be formed by a sputtering process. The barrier metal layer 270 may be omitted.

Figure 16:
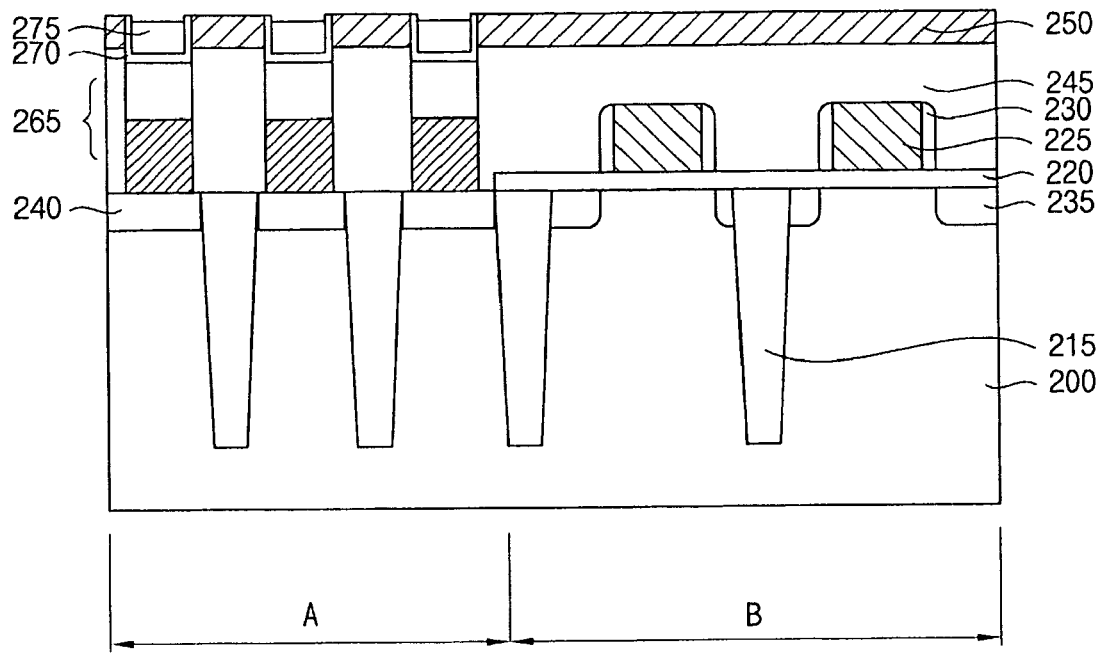

Referring to FIG. 16, a conductive layer (not illustrated) fills the second opening 272 and is formed on the second insulating interlayer pattern 250. A void (not illustrated) enclosed by the conductive layer may be formed in the second opening 272. An upper portion of the conductive layer is removed to form a conductive layer pattern 275 in the second opening 272 until the second insulating interlayer pattern 250 is exposed. The conductive layer pattern 275 may have an upper face whose level is lower than that of the second insulating interlayer pattern 250. Alternatively, the conductive layer pattern 275 has an upper face whose level is higher than or the same as that of the second insulating interlayer pattern 250. The void may be exposed by forming the conductive layer pattern 275.

In an exemplary embodiment, the removal process may have two steps of a CMP process. In a first step of the CMP process, a first slurry is used to remove an upper portion of the conductive layer. The first slurry may include hydrogen peroxide ($H_2O_2$) of which percent is over about 2 percent with respect to the overall first slurry. Then, in a second step of the CMP process, a second slurry having hydrogen peroxide ($H_2O_2$) of which percent is below about 0.5 percent with respect to the overall first slurry is used to control a height difference between the conductive layer pattern 275 and the second insulating interlayer pattern. The second slurry may have an etching selectivity with respect to the second insulating interlayer pattern. The void may be exposed by the removal process.

Figure 17:
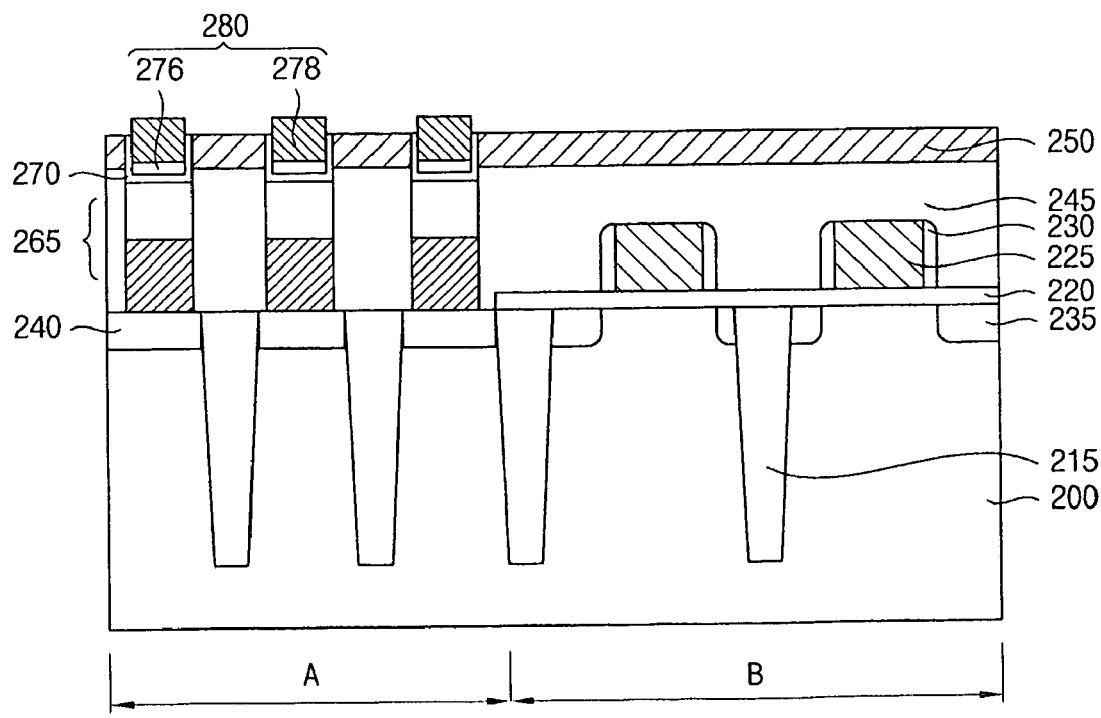

Referring to FIG. 17, an upper portion of the conductive layer pattern 275 is re-grown or swelled to form a plug 280, so that an upper portion of the exposed void is closed or the void does not remain in the plug. The plug 280 has a substantially level surface higher than that of the second insulating interlayer pattern 250 due to the re-growth or swelling. The plug 280 may include an upper plug portion 278 including re-growth or swelled portion, and a lower plug portion 276, which has substantially the same material as the conductive layer pattern 275. The re-growth or swelling process may be performed by a plasma oxidation process and/or a rapid thermal annealing (RTA) process. The re-growth or swelling of the conductive layer pattern may be caused by a reaction of a material included in the conductive layer pattern 275 and oxygen atoms. After the re-growth or swelling process is performed, the void may remain in the plug or not be present in the plug 280. Even when the void remains in the plug 280, the void is not exposed to the exterior. That is, even when the void may remain in the plug 280, an upper portion of the void is closed, so that the void is not exposed. The re-growth portion 278 (the upper portion of the plug formed by reaction of a material included in the conductive layer pattern and oxygen atoms) is formed upward and downward with respect to a top face of the conductive layer pattern 275.

In an exemplary embodiment, the conductive layer pattern 275 may be formed using tungsten. When tungsten is used as the conductive layer pattern 275, the upper plug portion 278 may include tungsten oxide. A volume ratio of the re-grown tungsten oxide and tungsten used for the re-growth is about 3:1.

Figure 18:
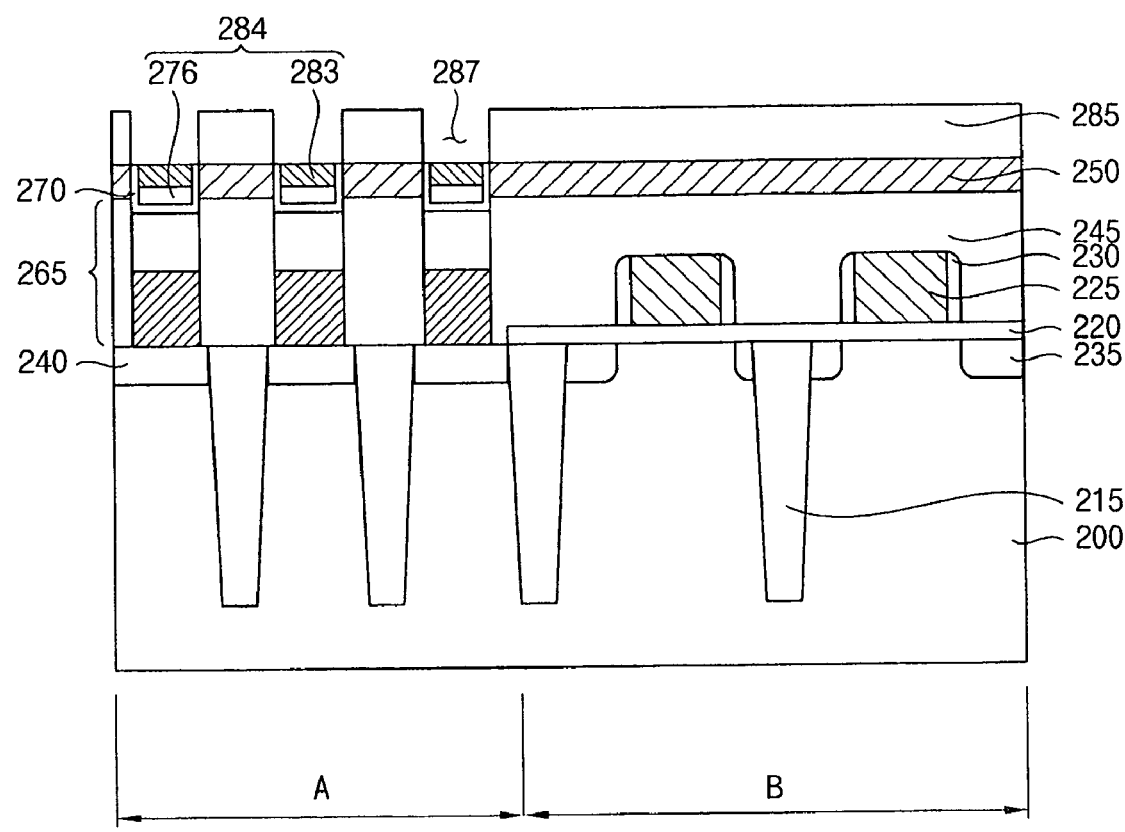

Referring to FIG. 18, the plug 280 is planarized to form a plug pattern 284. In an exemplary embodiment, a third insulating interlayer (not illustrated) is formed on the second insulating interlayer patter 245 to cover the plug 280. The third insulating interlayer may be formed using oxide by a CVD process or HDP process. The third insulating interlayer is planarized until the plug 280 is exposed. Alternatively, the third insulating interlayer and the plug 280 are planarized until the second insulating interlayer pattern 245 is exposed. The planarization process may include a CMP process. The CMP process may be performed using a slurry having an etching selectivity with respect to the third insulating interlayer.

In an exemplary embodiment, the third insulating interlayer is planarized until the plug 280 is exposed. Then, an upper portion of the plug 280 is selectively removed to form a third opening 287. That is, additional photolithography process for forming the third opening 287 may not be necessary.

In another exemplary embodiment, after performing the planarization process, an etch back process is performed to the plug 280 to form the plug pattern 284 and a third opening 287. The plug pattern 284 may have level surface. That is, the void is not exposed after the CMP process and/or the etch back process. In an exemplary embodiment, the re-growth portion 278 is completely removed or remains in the second opening 272. That is, the re-growth portion 278 has an upper face whose level is lower than, higher than or the same as that of the second insulating interlayer 245.

In an exemplary embodiment, an upper plug pattern 283 may be formed using tungsten oxide. When tungsten is oxidized, the oxidized tungsten has a resistance higher than that of tungsten before the oxidation. Accordingly, an oxidation process oxidizing tungsten has not been used before. However, in the exemplary embodiment, in spite of high resistance of tungsten oxide compared with tungsten, the upper plug pattern 283 including tungsten oxide is formed by re-growth or swelling of tungsten because an upper portion of the re-growth tungsten oxide having a relatively high resistance is partially removed by the CMP process, so that the plug pattern 284 may obtain planar surface and have low resistance.

Referring to FIG. 19, a spacer 290 is formed on a sidewall of the third opening 287. For example, the spacer 290 may be formed by depositing nitride material in the third opening 287 and performing an etch back process. The spacer 290 may reduce a contact area in which a lower electrode (295, see FIG. 21) and a phase-changeable layer (310, see FIG. 23) make contact with each other. When the contact area is small, the phase-changeable layer 310 may be readily converted into different phase with relatively small current.

Referring to FIG. 20, a lower electrode 295 is formed in the third opening 287. The lower electrode may be formed using a multi-layered structure in which titanium (Ti) and titanium nitride (TiN) are stacked.

Figure 21:
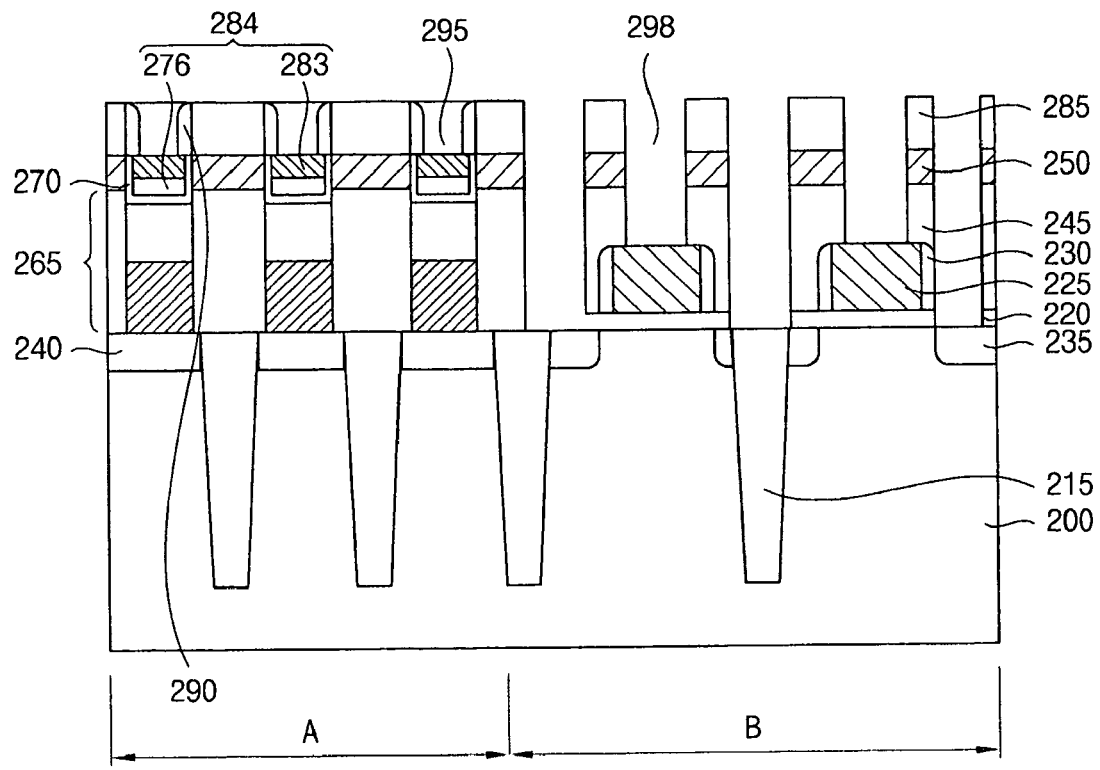

Referring to FIG. 21, a first contact hole 298 is formed through the first, second and third insulation interlayer patterns on the region B 245, 250 and 285.

Figure 22:
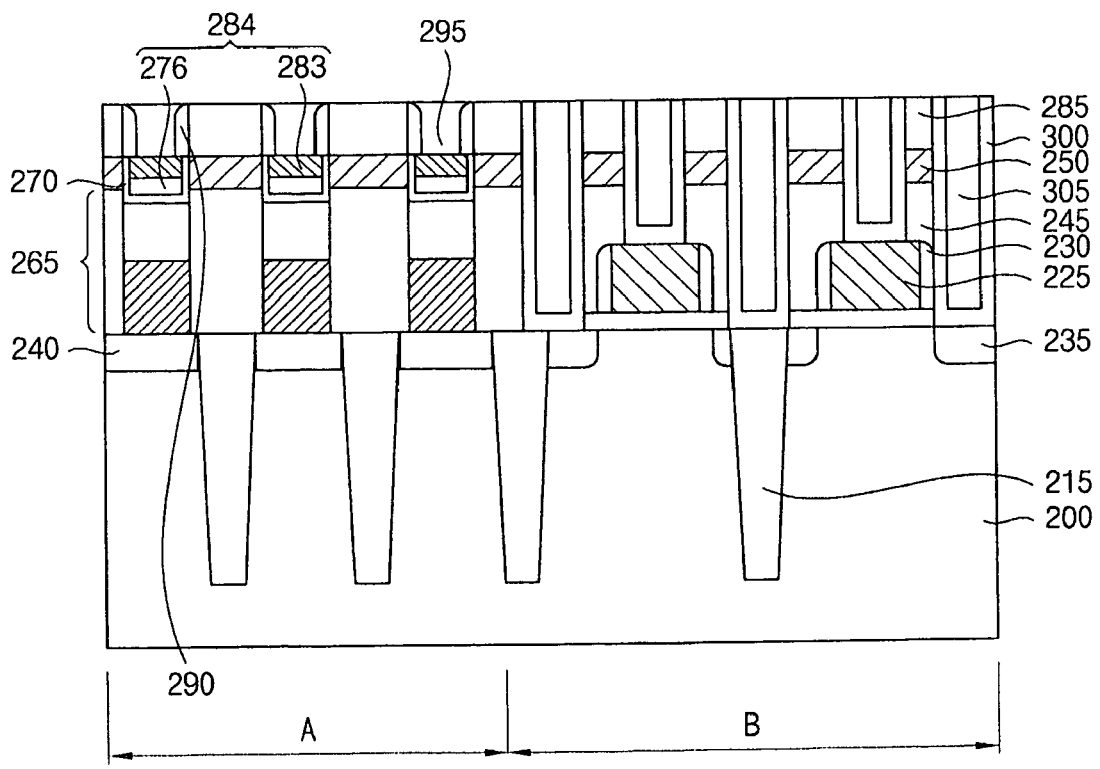

Referring to FIG. 22, a barrier metal layer 300 is formed on a sidewall of the first contact hole 298 and a plug 305 is formed on the barrier metal layer 300 in the first contact hole 298. The barrier metal layer 300 may be formed using refractory metal or refractory metal nitride such as titanium (Ti), titanium nitride (TiN), titanium tungsten composition (TiW), a composition layer of titanium and titanium nitride (Ti/TiN), The barrier metal layer 300 may have a thickness of about 100 Å. The barrier metal layer 300 prevents generation of high resistance due to a direct contact of the plug 305 and the substrate 200 or increases adhesion of the plug 305 and the barrier metal layer 300. The third opening 287 is filled with a conductive material so that the plug 305 is formed on the barrier metal layer 300. The plug 305 may be formed using tungsten.

Figure 23:
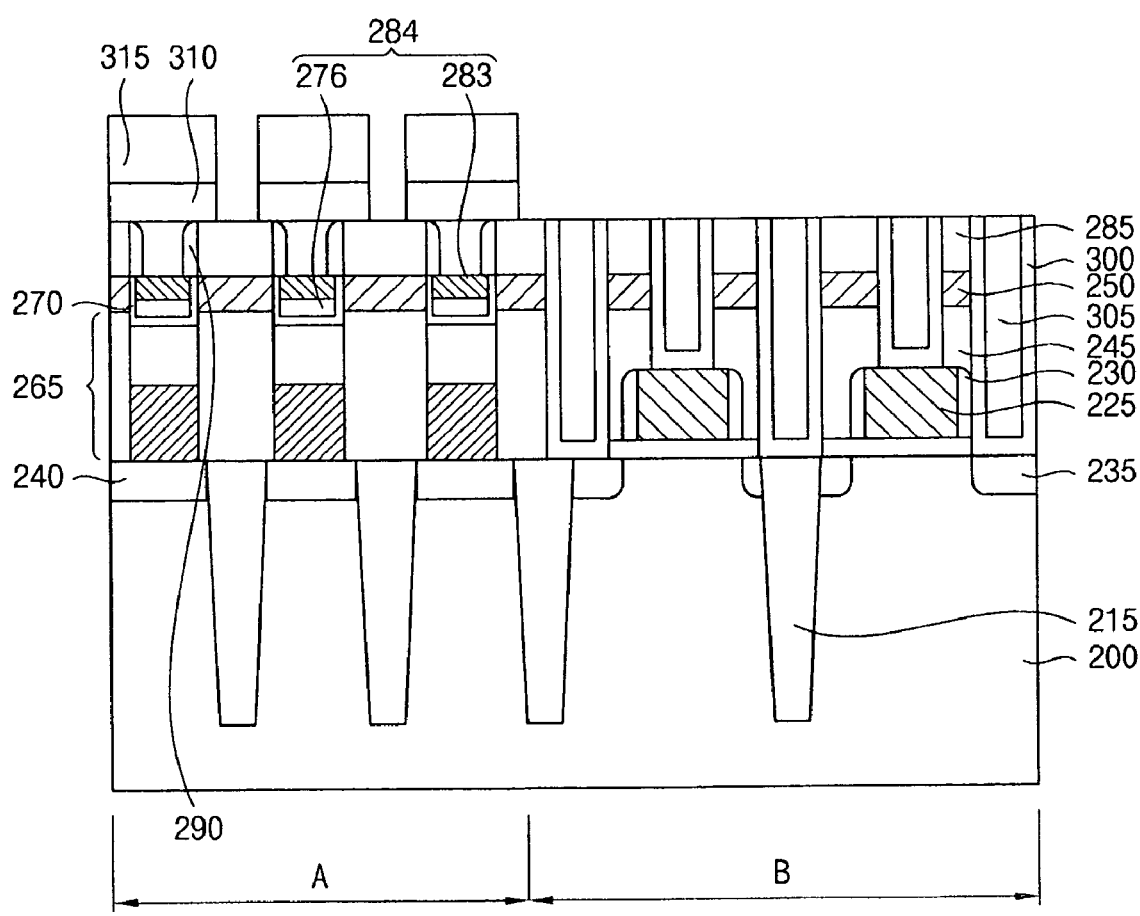

Referring to FIG. 23, a phase-changeable layer pattern 310 and an upper electrode layer pattern 315 are formed on the lower electrode 295. A phase-changeable layer (not illustrated) and an upper electrode layer (not illustrated) are sequentially formed on the third insulating interlayer pattern 285. The phase-changeable layer may be formed by a physical vapor deposition (PVD) process. The phase-changeable layer and the upper electrode layer are patterned to form the phase-changeable layer pattern 310 and the upper electrode layer pattern 315. The phase-changeable layer pattern 310 may include a chalcogenide material of $Ge_2Sb_2Te5$. The phase-changeable layer pattern 310 may be formed using a first target including GeTe composition and a second target including $Sb_2Te_3$ composition. The first target and/or the second target may include impurities such as oxygen, silicon, carbon, nitrogen, etc. The impurities may control stabilization time of the chalcogenide material. The upper electrode layer pattern 315 may have a structure in which titanium and titanium nitride are stacked. The phase-changeable layer pattern 310 covers the lower electrode 295, so that the lower electrode 295 may not be exposed.

Figure 24:
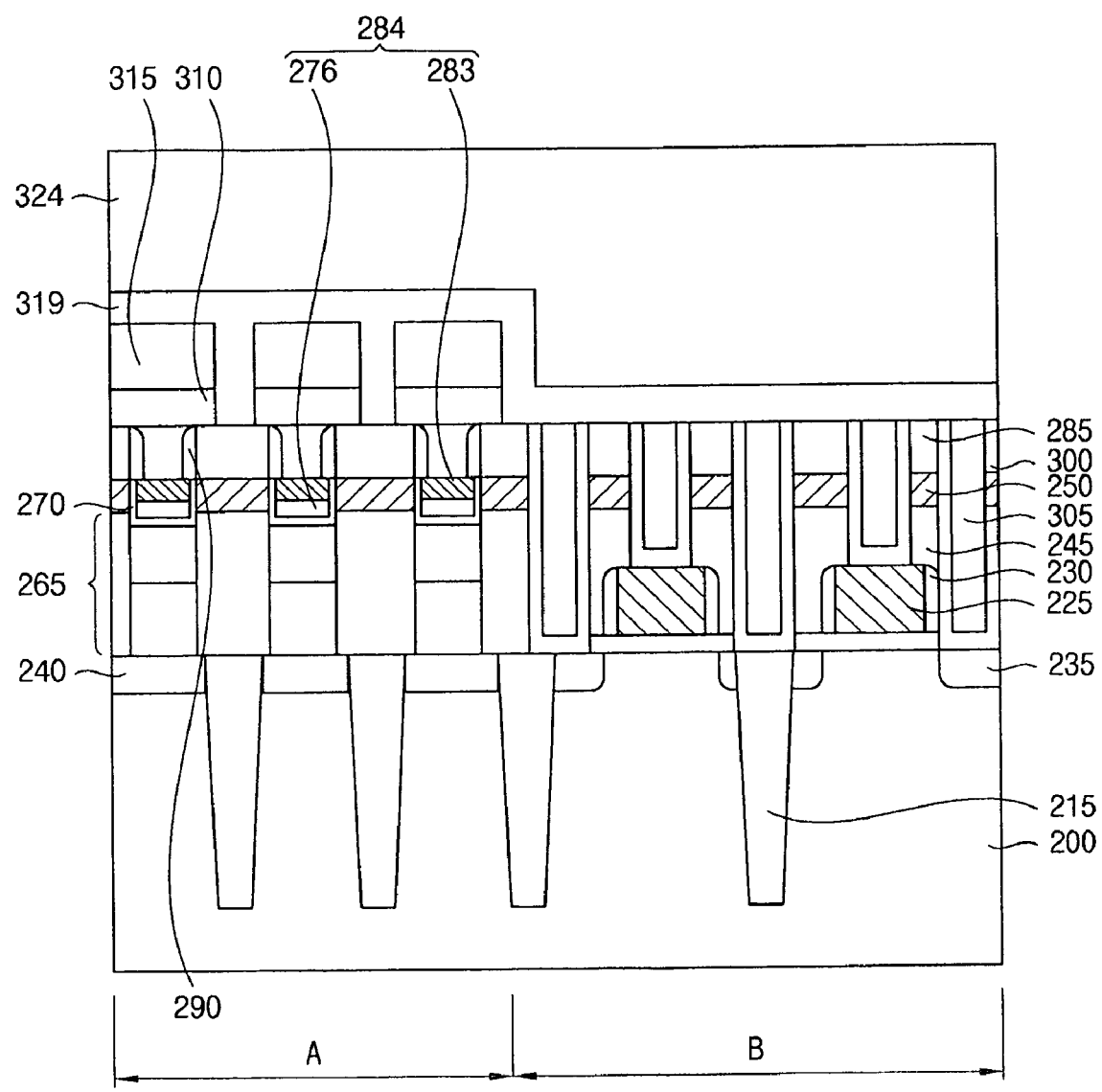

Referring to FIG. 24, a capping layer 319 and a fourth insulating interlayer 324 formed on the third insulating interlayer pattern 285 and cover the phase-changeable layer pattern 310 and the upper electrode layer pattern 315. For example, the capping layer 319 may be formed by forming a nitride layer having a thickness about 1000 Å and forming an aluminum oxide layer having a thickness about 50 Å. The capping layer 319 may be formed by an atomic layer deposition (ALD) process. The capping layer 319 may prevent impurities of the fourth insulating interlayer 324 from infiltrating into the phase-changeable layer pattern 310. The fourth insulating interlayer 324 is formed on the capping layer 319. The fourth insulating interlayer 324 may be formed using boro-phospho-sililcate glass (BPSG), tonen silazene (TOSZ), undoped silicate glass (USG), spin on glass (SOG), flowable oxide (FOX), tetra-ethyl-ortho-silicate (TEOS), high density plasma-CVD oxide (HPD-CVD), etc.

Figure 25:
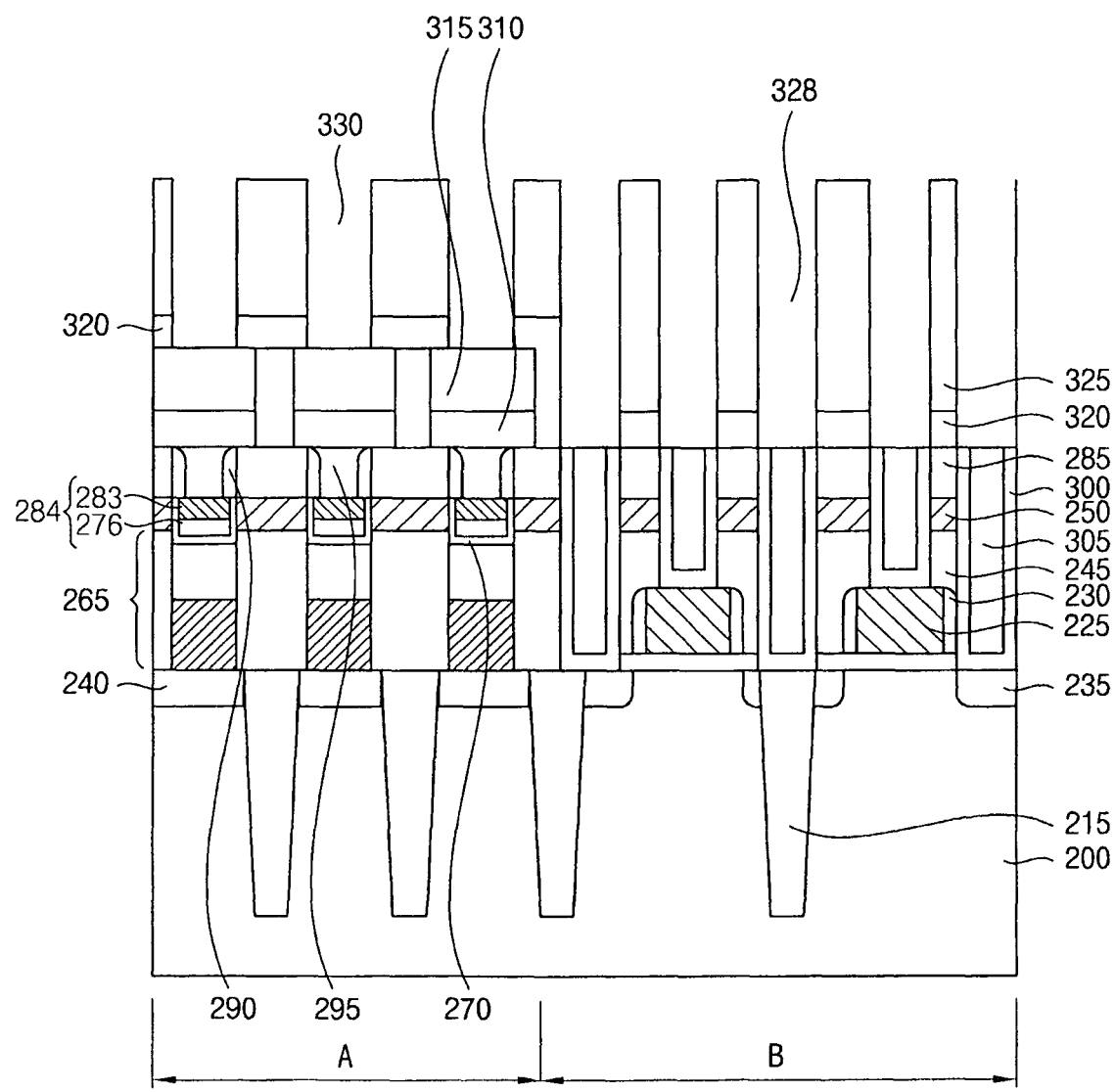

Referring to FIG. 25, a second contact hole 328 and a third contact hole 330 are formed through the fourth insulating interlayer 324, so that a fourth insulating interlayer pattern 325 is formed. For example, the second contact hole 328 exposing the plug 305 is formed through the fourth insulating interlayer 324 on the region B. The third contact hole 330 exposing the upper electrode pattern 315 is formed through the fourth insulating interlayer 324 on the region A.

Figure 26:
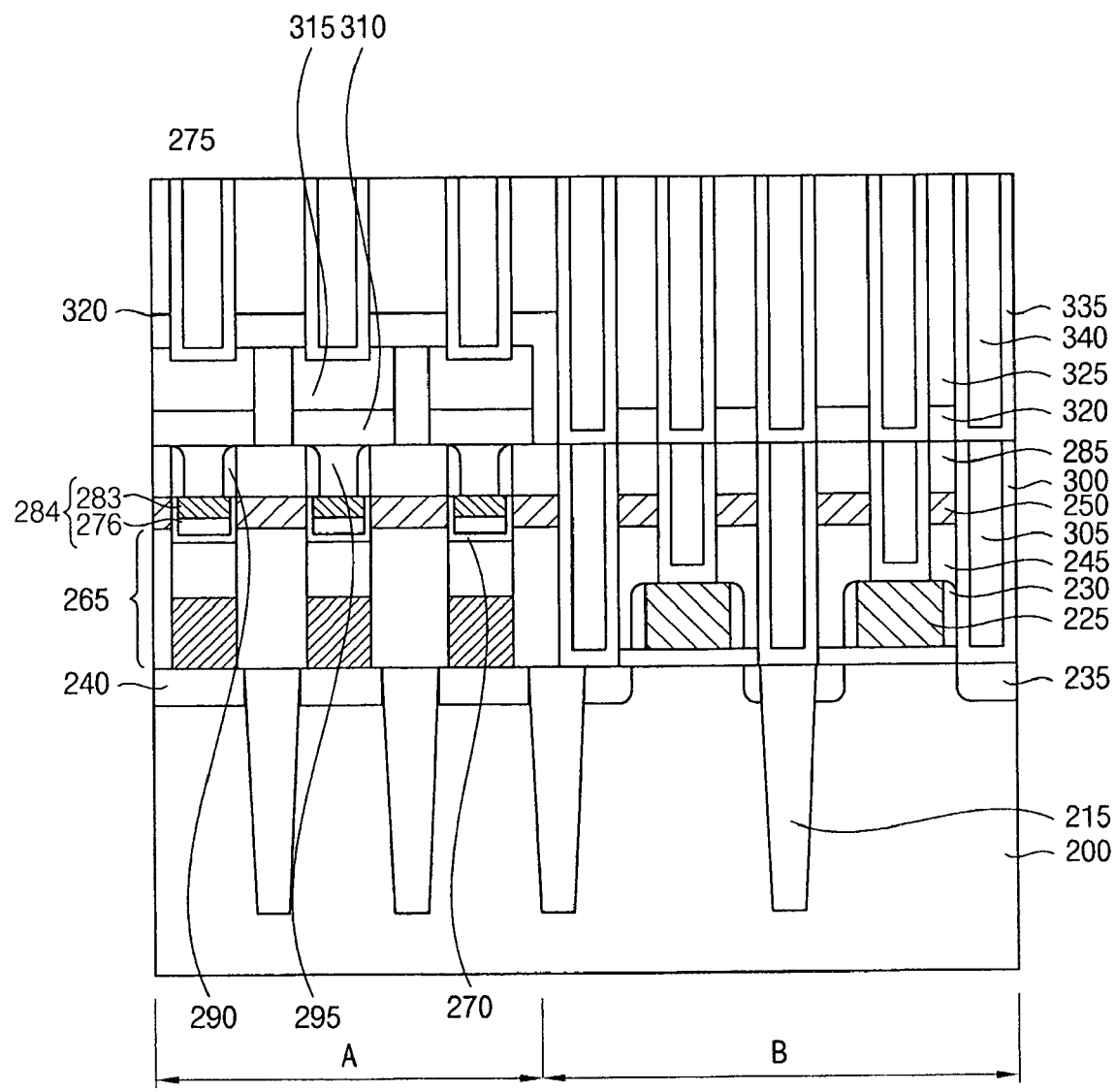

Referring to FIG. 26, a barrier metal layer 335 is formed on sidewalls of the second contact hole 328 and the third contact hole 330, and a plug 340 is formed on the barrier metal layer 335 in the second contact hole 328 and the third contact hole 330. The barrier metal layer 335 may be formed using refractory metal or refractory metal nitride such as titanium (Ti), titanium nitride (TiN), titanium tungsten composition (TiW), a composition layer of titanium and titanium nitride (Ti/TiN), The barrier metal layer 335 may have a thickness of about 100 Å. The barrier metal layer 335 prevents generation of high resistance due to a direct contact of the plug 340 and the substrate 200 or increases adhesion of the plug 340 and the barrier metal layer 335. The second contact hole 328 and the third contact hole 330 are filled with the plug 340.

Figure 27:
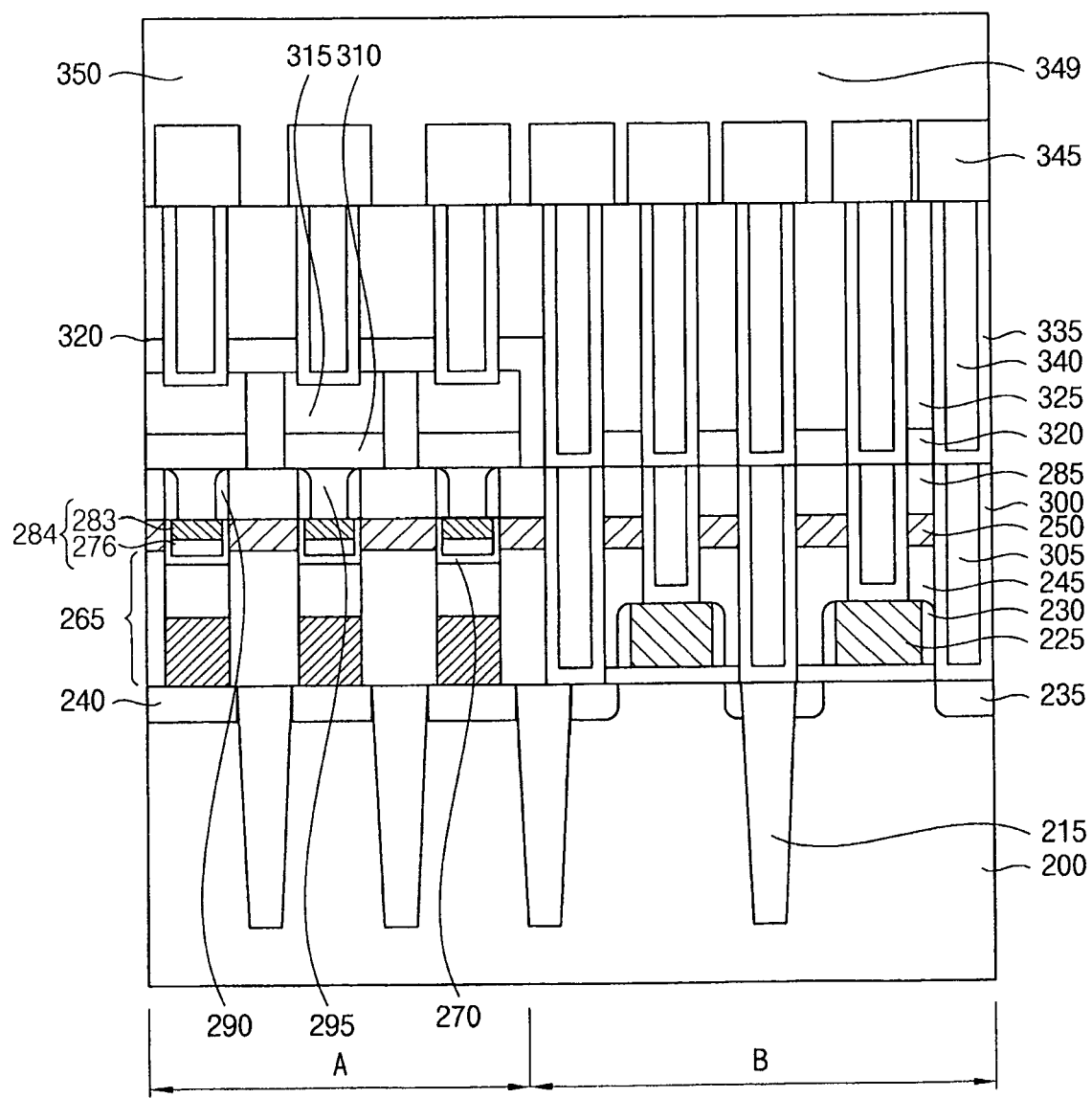

Referring to FIG. 27, a metal wire 345 is formed on the plug 340, and a fifth insulating interlayer 350 covers the metal wire 345. The metal wire 345 is electrically connected to the plug 340. The metal wire 345 may be formed using aluminum (Al). In an exemplary embodiment, the metal wire 345 may have a structure in which a metal and a capping layer are stacked. The fifth insulating interlayer 349 be formed using boro-phospho-sililcate glass (BPSG), tonen silazene (TOSZ), undoped silicate glass (USG), spin on glass (SOG), flowable oxide (FOX), tetra-ethyl-ortho-silicate (TEOS), high density plasma-CVD oxide (HPD-CVD), etc.

According the exemplary embodiment of the present invention, a plug may have a level surface by a re-growing of the plug. That is, even when the plug has a void therein, the plug may have a level surface after a CMP process planarizing the plug. Accordingly, a uniform current may be transferred through the plug. Also, after re-growing the plug and forming an insulation interlayer covering the plug, a planarization process removes an upper portion of the plug. Accordingly, additional lithography process steps for forming a contact hole may not be necessary.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of forming a plug comprising:
   forming a first insulating interlayer on a substrate
   forming a contact hole through the first insulating interlayer;
   forming a tungsten pattern in the contact hole, wherein forming a tungsten pattern includes forming a void enclosed by the tungsten pattern in the contact hole; and
   converting an upper portion of the tungsten pattern into a tungsten oxide pattern, so that the tungsten oxide pattern is protruded over the first insulating interlayer and the void is removed.

2. The method of claim 1, wherein forming the tungsten pattern includes:
   forming a tungsten layer in the contact hole to fill up the contact hole; and
   planarizing the tungsten layer to form the tungsten pattern having a top surface substantially lower than that of the first insulating interlayer.

3. The method of claim 2, wherein converting the upper portion of the tungsten pattern includes a rapid thermal annealing process or a plasma oxidation process.

4. The method of claim 2, wherein converting the upper portion of the tungsten pattern includes re-growing or swelling the tungsten pattern, so that the tungsten oxide pattern is protruded over the first insulating interlayer and further comprising planarizing the protruded tungsten oxide pattern until the first insulating interlayer is exposed.

5. The method of claim 1, wherein forming the tungsten pattern includes:
   forming a tungsten layer in the contact hole to fill up the contact hole; and
   planarizing the tungsten layer to form the tungsten pattern having a top surface substantially higher than that of the first insulating interlayer.

6. The method of claim 1, wherein converting the upper portion of the tungsten pattern includes re-growing or swelling the tungsten pattern, so that the tungsten oxide pattern is protruded over the first insulating interlayer, and further comprising forming a second insulating interlayer on the first insulating interlayer to cover the tungsten oxide pattern and removing the second insulating interlayer until the tungsten oxide pattern is exposed.

* * * * *